United States Patent
Abraham et al.

Patent Number: 5,670,775
Date of Patent: Sep. 23, 1997

[54] CURRENT-BOOSTED POSITIVE FEEDBACK LOGARITHMIC TRANSRESISTANCE AMPLIFIER FOR CURRENCY VALIDATORS

[75] Inventors: Claude Abraham, Stow; Philip C. Dolsen, Mentor, both of Ohio

[73] Assignee: Ardac, Inc., Eastlake, Ohio

[21] Appl. No.: 493,992

[22] Filed: Jun. 23, 1995

[51] Int. Cl.⁶ .................................................. H01J 40/14
[52] U.S. Cl. ........................ 250/214 A; 250/214 LA; 250/556; 330/59
[58] Field of Search ................ 250/214 A, 214 L, 250/556, 214 AG, 566, 214.1, 214 R, 214 C, 214 LA; 327/534–537, 350, 103, 589, 590; 330/9, 110, 280–282, 59, 308

[56] References Cited

U.S. PATENT DOCUMENTS

| | | | |
|---|---|---|---|
| 4,096,382 | 6/1978 | Numata et al. | 250/214 L |
| 4,366,440 | 12/1982 | Olson et al. | 330/282 |
| 5,030,925 | 7/1991 | Taylor | 250/214 A |
| 5,523,575 | 6/1996 | Machida et al. | 250/214 A |

*Primary Examiner*—Que Le
*Attorney, Agent, or Firm*—Renner, Kenner, Greive, Bobak, Taylor & Weber

[57] ABSTRACT

A current boosted positive feedback logarithmic transresistance amplifier is provided for currency validators. The amplifier has a photo-diode capable of producing a current in response to light, connected to an operational amplifier having both a positive and a negative feedback branch. A logarithmic density amplifier having a feedback resistor and a log diode connected in shunt with the resistor as a dynamic feedback to the amplifier is connected to the positive feedback branch of the current boosting amplifier by way of the log diode. The summing action at the inputs of the current boosting amplifier result in a current at the log diode that is a direct multiple of the current in the photo-diode.

17 Claims, 1 Drawing Sheet

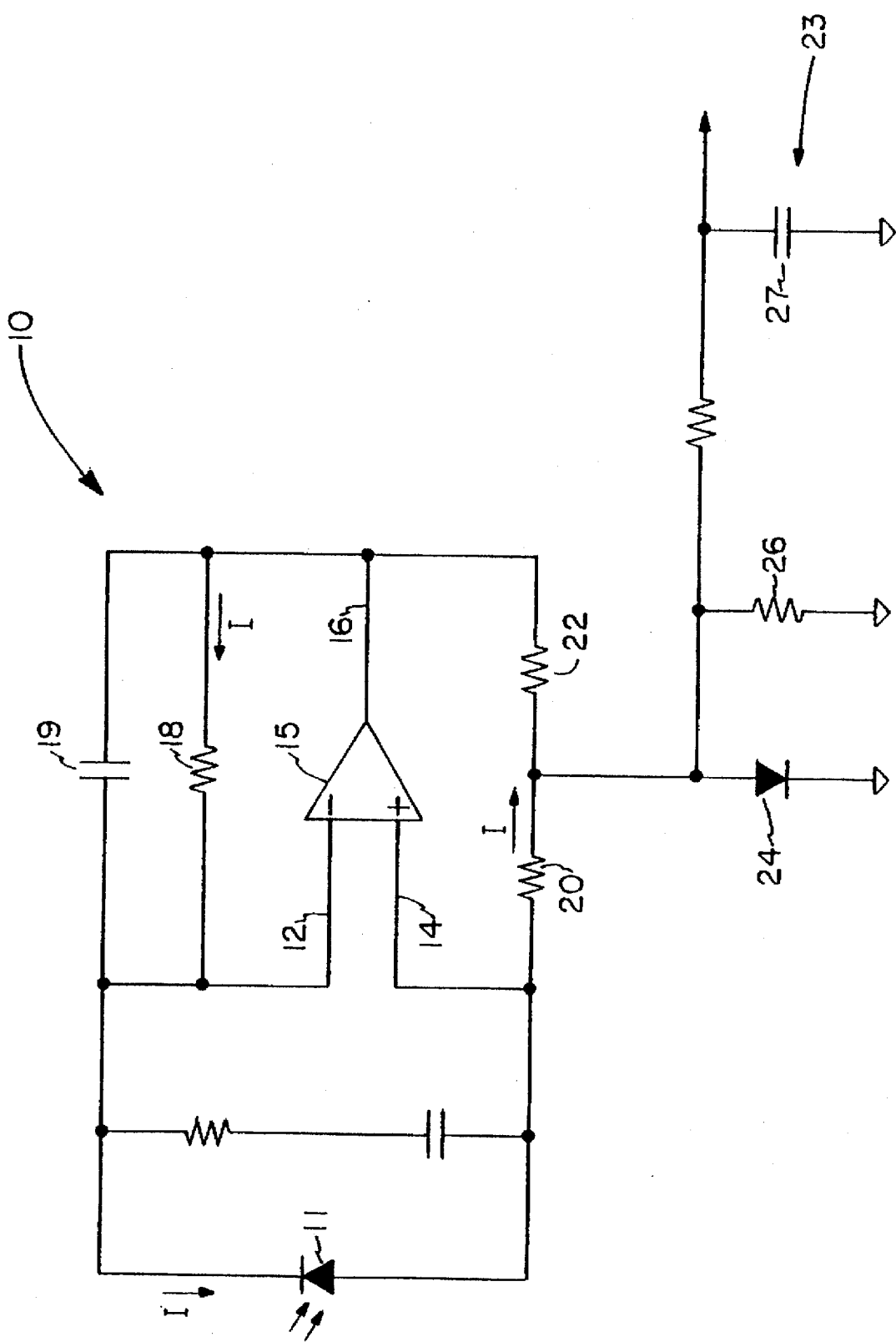

CURRENT-BOOSTED POSITIVE FEEDBACK LOGARITHMIC TRANSRESISTANCE AMPLIFIER FOR CURRENCY VALIDATORS

TECHNICAL FIELD

The invention herein resides in the art of apparatus for testing and determining the validity of a paper being offered as a valid security, note, currency, or the like. More particularly, the invention relates to such testing apparatus which measure the optical density of a security. Specifically, the invention relates to logarithmic amplifier circuits which function as an optical density amplifier.

BACKGROUND ART

Heretofore, it has been known to use security validation devices wherein grid patterns on the security are tested by means of a reticle and photocell positioned on a side of the paper opposite that of a light source. Movement of the reticle and/or the paper creates relative movement between the reticle and grid pattern and a determination of the validity of the paper is then made on the basis of the registration achieved between the reticle and the grid pattern.

More recently, it has been known to incorporate tests upon other characteristics of the security such as the optical density of a note. It has been found that with most securities the optical density of a valid security is quite different from that of a photocopy. Comparisons of such different optical densities is facilitated by utilizing an logarithmic amplifier circuit. In such a circuit a diode is utilized as a dynamic feedback branch in shunt with a feedback resistor so as to result in a more wide separation between points in a voltage spectrum.

In known density amplifiers, using a photo-diode, the current out of the photo-diode is frequently very low. Typically this current is routed through the dynamic feedback or log diode directly, and the circuit then functions as a logarithmic density amplifier. However, the log diodes available do not have logarithmic characteristics below 100 nanoamps, thus, it is necessary to use relatively high light levels in order to ensure that all densities of interest never fall below such a current level.

Accordingly, it is desired to obtain a logarithmic amplifier for currency validators which is capable of utilizing relatively small currents from a photo-diode without noise, or other disturbances, and likewise preserving closed loop stability.

DISCLOSURE OF INVENTION

In light of the foregoing, it is an aspect of the invention to provide a current-boosted positive feedback logarithmic amplifier capable of utilizing relatively small currents out of the photo-diode.

Another aspect of the invention is the provision of such an amplifier which functions without ringing, noise, or other disturbances and preserving closed loop stability.

A further aspect of the invention is the provision of a current boosting amplifier for providing a current to a logarithmic amplifier which is a multiple of the photo-diode current.

Still another aspect of the invention is the provision of such an amplifier which is simplistic in design, reliable in operation, inexpensive to construct, and readily conducive to implementation with presently-existing validation devices.

The foregoing and other aspects of the invention which will become apparent as the detailed description proceeds are achieved by the improvement in an optical density sensing circuit for security, the sensing circuit having a photo-diode capable of producing a current in response to light, the photo-diode connected to a first amplifier, the first amplifier having a dynamic feedback branch including a feedback resistor and a log diode connected in shunt with the feedback resistor, the improvement comprising: a mixed feedback current boosting means for providing a current to the log diode, said current being a direct multiple of the current in the photo-diode.

Other aspects of the invention are attained by an optical density sensing circuit for security, comprising: a photo-diode capable of producing a current in response to light; a first amplifier connected to said photo-diode, the first amplifier having a dynamic feedback branch including a feedback resistor, and a log diode connected in shunt with the said feedback resistor; and, a mixed feedback current boosting means for providing a current to said log diode, said current being a direct multiple of the current in said photo-diode.

Still other aspects of the invention are attained by a current boosting amplifier for providing a current to the log diode of a logarithmic amplifier from a photo-diode, comprising: an amplifier having a positive feedback branch and a negative feedback branch, the photo-diode being connected between said positive and negative feedback branches.

BRIEF DESCRIPTION OF THE DRAWINGS

For a complete understanding of the objects, techniques, and structure of the invention reference should be made to the following detailed description and accompanying drawing wherein:

A schematic circuit diagram is illustrated showing an amplifier according to the present invention.

BEST MODE FOR CARRYING OUT THE INVENTION

Referring now to the drawing, it can be seen that a current boosting circuit according to the invention is designated generally by the numeral 10. As shown the circuit 10 comprises a photo-diode 11 connected to the input terminals 12 and 14 respectively of an operational amplifier 15. The negative or inverting input 12 of the op-amp 15 is further connected to the op-amp output terminal 16 by way of a negative feedback branch including a resistor 18 and capacitor 19. Likewise, the positive or summing input 14 of the op-amp 15 is connected to the output terminal 16 by way of a positive feedback branch including resistors 20 and 22.

As shown, circuit 10 is further connected to the dynamic feedback branch of a conventional logarithmic density amplifier circuit 23. The dynamic feedback branch of the logarithmic density amplifier 23 includes a log diode 24, a resistor 26 and a capacitor 27 connected in parallel between the negative input terminal 28 and output terminal 30 of an operational amplifier 31. Circuit 10 is connected to log circuit 23 between resistors 20 and 22 as shown.

As can be seen the circuit 10 is unique in that it uses positive feedback in conjunction with negative feedback making the circuit a mixed feedback topology. The purpose of using both negative and positive feedback is to utilize both of the op-amp inputs 12 and 14 as summing junctions. Light transmitted to the photo-diode 11 from a light source such as an LED causes a current I to be produced in the photo-diode. Current I is forced into the resistor 18 due to summing action at the op-amp negative input terminal 12.

Current I is also forced into the resistor 20 due to summing action at the op-amp positive input terminal 14. Those skilled in the art will recognize that if input offset voltage and the resultant output error are ignored the two input terminals 12 and 14 of the op-amp 15 may be considered to be at equal potential. This potential is designated as $V_r$ with respect to ground. Accordingly, the potential at the op-amp output terminal 16 is $V_r + R_1$ I, where $R_1$ represents the resistance in ohms of the resistor 18. Similarly, the potential at the anode of the log diode 24 is $V_r - R_2$ I, where $R_2$ is the resistance in ohms of the resistor 20. Therefore, the potential across resistor 22 is the difference between the potential at the op-amp output terminal 16 and the potential at the anode of the logging diode 24, or $(V_r R_1\ I) - (V_r - R_2\ I)$ or $R_1\ I + R_2\ I$ which of course, simplifies to $(R_1 + R_2)$ I. Thus, according to Ohms Law, the current in resistor 22 is simply $(R_1 + R_2)\ I/R_3$, where $R_3$ is the resistance in ohms of the resistor 22. As can be seen, the current in resistor 22 is thus a constant times the current I in the photodiode 11. The value of this constant is $(R_1 + R_2)/R_3$, which does not change with temperature, optical density, LED intensity, or photo-diode sensitivity.

Thus the current in the logging diode 24 is $I + (R_1 + R_2)\ I/R_3$, or $I\ (1 + (R_1 + R_2)/R_3)$ as such, the current in the logging diode 24 is a constant multiple of the current I in the photo-diode 11. Again, this constant does not vary with temperature, optical density, light intensity, or photo-diode sensitivity.

By was of example if the resistors 18 and 20 each have a value of 10.0 megohms and the resistor 22 has a value of 63.4 kilohms the current I in the photodiode 11 would be multiplied by a factor of $1 + (1 \times 10^7 + 1 \times 10^7)/63.4 \times 10^3) = 316.46$. This multiplied current has been experimentally determined to be found in the logging diode 24. Experimentation has also revealed no trace of ringing, noise, oscillation, or other disturbances. Further, the dividing action of the resistor 22 in combination with the log diode 24 and capacitor 27 ensures that the positive feedback of the circuit 10 is a fraction of the negative feedback, thereby preserving closed-loop stability.

In view of the foregoing, those skilled in the art should recognize that the use of the circuit 10 as described herein allows the current in the photo-diode 11 to be multiplied by a significant factor. As such; a current may be maintained in the logging diode 24 that is well within the range necessary for logarithmic operation of the diode 24 even when relatively low current levels are present in the photo-diode 11. Thus, the light intensity required for optical density measurement may be significantly reduced.

Thus it can be seen that the objections of the invention have been satisfied by the structure presented above. While in accordance with the patent statutes only the best mode and preferred embodiment of the invention has been described and presented in detail, it is to be understood that the invention is not limited thereto or thereby. Accordingly, for an appreciation of the true scope and breadth of the invention reference should be made to the following claims.

What is claimed is:

1. In an optical density sensing circuit for security validators, the sensing circuit having a photo-diode capable of producing a current in response to light, the photodiode connected to a first amplifier, the first amplifier having an dynamic feedback branch, the dynamic feedback branch including a feedback resistor, and a log diode connected in shunt with the feedback resistor, the improvement comprising:

a mixed feedback current boosting means for providing a current to the log diode, said current being a direct multiple of the current in the photo-diode.

2. The improvement in an optical density sensing circuit according to claim 1, wherein said current boosting means comprises an amplifier having a positive feedback branch and a negative feedback branch the photo-diode being connected between said positive and negative feedback branches.

3. The improvement in an optical density sensing circuit according to claim 2, wherein said amplifier is an operational amplifier having a negative input terminal, a positive input terminal, and an output terminal.

4. The improvement in an optical density sensing circuit according to claim 3, wherein said negative feedback branch is established by a first resistor connected between said negative input terminal and said output terminal.

5. The improvement in an optical density sensing circuit according to claim 4, wherein said positive feedback branch is established by second and third resistors connected in series between said positive input terminal and said output terminal.

6. The improvement in an optical density sensing circuit according to claim 5, wherein the anode of the log diode is connected between said second and third resistors.

7. An optical density sensing circuit for a security validator, comprising:

a photo-diode capable of producing a current in response to light;

a first amplifier connected to said photo-diode, said first amplifier having a dynamic feedback branch including a feedback resistor and a log diode; and a mixed feedback current boosting amplifier for providing a current to the log diode, said current being a direct multiple of the current in the photo-diode.

8. An optical density sensing circuit according to claim 7, wherein said current boosting amplifier includes a positive feedback branch and a negative feedback branch, and said photo-diode is connected between said positive feedback branch and said negative feedback branch.

9. An optical density sensing circuit according to claim 8, wherein said current boosting amplifier is an operational amplifier having a negative input terminal, a positive input terminal, and an output terminal.

10. An optical density sensing circuit for security validators according to claim 9, wherein said positive feedback branch is established by first and second resistors connected in series between said positive input terminal and said output terminal.

11. An optical density sensing circuit for security validators according to claim 10, wherein said negative feedback branch is established by a third resistor connected between said negative input terminal and said output terminal.

12. An optical density sensing circuit for security validators according to claim 11, wherein the anode of the log diode is connected between said first and second resistors.

13. A current boosting amplifier for providing a current to the log diode of a logarithmic amplifier from a photo-diode, comprising a positive feedback branch and a negative feedback branch, the photo-diode being connected between said positive and negative feedback branches.

14. A current boosting amplifier as set forth in claim 13, wherein said amplifier is an operational amplifier having a negative input terminal, a positive input terminal, and an output terminal.

15. A current boosting amplifier according to claim 14, wherein said positive feedback branch is established by first and second resistors connected in series between said positive input terminal and said output terminal.

16. A current boosting amplifier according to claim 15, wherein said negative feedback branch is established by a third resistor connected between said negative input terminal and said output terminal.

17. A current boosting amplifier according to claim 16, wherein the anode of the log diode is connected between said first and second resistors so that a current produced in the photo-diode is forced into said third resistor by summing action at said negative input terminal and into said second resistor by summing action at said positive input terminal so as to result in an current at the log diode which is a multiple of the current in the photo-diode.

* * * * *